United States Patent [19]
Aubry

[11] Patent Number: 5,362,993
[45] Date of Patent: Nov. 8, 1994

[54] WEIGHTED AVERAGE SERVO BURST PEAK DETECTOR FOR DISK DRIVE READ

[75] Inventor: Laurent Aubry, Sunnyvale, Calif.

[73] Assignee: Quantum Corporation, Milpitas, Calif.

[21] Appl. No.: 119,748

[22] Filed: Sep. 10, 1993

[51] Int. Cl.$^5$ .................. G11C 27/02; H03K 5/159
[52] U.S. Cl. ...................... 327/94; 327/58; 327/91
[58] Field of Search ............ 307/350, 352, 353, 272.2; 328/151

[56] References Cited

U.S. PATENT DOCUMENTS

| | | | |
|---|---|---|---|
| 4,031,479 | 6/1977 | Thomas, Jr. et al. | 307/353 |
| 4,477,849 | 10/1984 | Berger | 360/77 |
| 4,533,844 | 8/1985 | Miller et al. | 307/352 |
| 4,669,004 | 5/1987 | Moon et al. | 360/77 |
| 4,698,523 | 10/1987 | Gershon et al. | 307/353 |
| 4,868,470 | 9/1989 | Bucska et al. | 318/561 |

OTHER PUBLICATIONS

Att Data Sheet, ATT91C010 Low-Power Reach1 Device, Apr. 1991, 23 pages (pp. 1-23).

*Primary Examiner*—Timothy P. Callahan
*Assistant Examiner*—Toan Tran
*Attorney, Agent, or Firm*—David B. Harrison

[57] ABSTRACT

A peak detector samples and holds amplitudes of pulses of a servo burst and includes a master peak detector for following a portion of a rising edge of each pulse until a peak amplitude is reached, and for decaying rapidly at a falling edge of each burst following the peak until a rising edge of a subsequent burst is intercepted at a point of interception, and for generating a control window extending from the point of interception of a rising edge to a peak value of each subsequent pulse; a slave peak detector enabled by the control window of the master detector for following the portion of the rising edge of each burst from the point of interception to the peak value, and for holding the peak value reached by the master detector during the control window, a holding circuit responsive to the slave detector and having a first, rapid time constant for rapidly acquiring a peak value of at least one initial peak of the burst, and having a second, slower time constant for adjusting the initially acquired peak value in light of subsequent peak values of the burst; and, a switching circuit for automatically switching the holding circuit from the first time constant to the second time constant.

10 Claims, 3 Drawing Sheets

WEIGHTED AVERAGE SERVO BURST PEAK DETECTOR FOR DISK DRIVE READ

FIELD OF THE INVENTION

The present invention relates to peak detector circuits and methods. More particularly, the present invention relates to a weighted average master-slave peak detector for detecting servo burst peak amplitudes within a disk drive read channel and for putting out a weighted average thereof.

BACKGROUND OF THE INVENTION

Magnetic data transducer heads produce an electrical output signal having a level which is proportional to the amount of magnetic flux transduced from a disk data storage surface, and therefore make excellent position transducers for a head position servo loop of a disk drive.

In one arrangement, servo positioning signals are recorded in a phase coherent, side-by-side relationship, so that as the head passes over half of each track, the patterns result in electrical signals which are integrated in the head. If the head is exactly between the two side-by-side patterns, a resultant position error signal put out by the head is zero. Sometimes, a dibit pulse pattern is employed, and one example of a peak detector for sampling and holding pulse peaks from a dibit servo pattern is described in U.S. Pat. No. 4,477,849. Apparatus enabling detection of a true average of N signal samples is described in U.S. Pat. No. 5,868,470. This latter approach employed two capacitors in an analog arrangement.

In another arrangement, radially offset, circumferentially staggered servo bursts provide servo head positioning information. In this latter arrangement, relative amplitudes of the single-frequency burst fields are sampled and held, converted to digital values and compared to develop a position error signal (PES). An example of a peak detector for sampling and integrating staggered burst fields is provided in commonly assigned U.S. Pat. No. 4,669,004 to Moon et al, particularly in conjunction with the description of FIG. 13 thereof. The disclosure of the '004 patent is incorporated herein by reference.

Ideally, a peak detector will acquire a peak value of a burst very rapidly. Once the value is acquired, the peak detector ideally will appear to an analog to digital converter as manifesting an infinite hold time. In other words, once a peak is acquired, it is held until the peak detector is reset. One approach known in the prior art is to arrange a peak detector as having a master portion, and a slave portion. The master portion desireably manifests a sharp rise characteristic which follows each pulse to its peak. The slave portion essentially follows the master portion, but only while the master portion is actively following a rising edge of an incoming waveform. After the master begins its decay, the slave effectively disconnects from the master, and maintains its output at, or near the peak of the signal being followed. A benefit of this arrangement is that the amplitude of each pulse peak will be caught by the master and saved by the slave. If one has the capability of processing each peak with a fast analog to digital processor, it is possible to average the noise. However, if the noise is not averaged, the master-slave arrangement catches what is effectively the amplitude of the last pulse peak of the burst. So, if the detected burst sequence includes ten pulse peaks, and the peak detector circuit does not effectively process each one, or multiple ones of them, the value available for processing will effectively be the last peak of the burst being held.

One example of a conventional master-slave peak detector of the type being described above is the ATT 91C012 low power REACH1 device. While this device generally worked well, as track densities have increased with narrower tracks, problems have arisen with noise, including chaotic noise. A hitherto unsolved need has arisen for an improved peak detector of the master-slave type enabling weighted averaging, which thereby realizes improved performance in the presence of higher levels of noise attributable to smaller effective track widths.

SUMMARY OF THE INVENTION WITH OBJECTS

A general object of the present invention is to provide a peak detector for a disk drive servo loop which rapidly acquires a peak value of an incoming servo burst, and which thereafter averages subsequent peaks to provide a weighted average peak value over time, in a manner overcoming limitations and drawbacks of the prior art.

Another general object of the present invention is to modify and improve a master-slave digital peak detector employed for detecting servo peaks in a disk drive read data channel so as to provide an initial rapid acquisition mode followed by a subsequent weighted averaging/integrating mode, in order to minimize disturbances due to noise, in a manner overcoming limitations and drawbacks of the prior art.

In accordance with the present invention, a peak detector for sampling and holding amplitudes of pulses of a servo burst comprising a first peak detector for following a portion of a rising edge of each pulse until a peak amplitude is reached, and for decaying rapidly at a falling edge of each burst following the peak until a rising edge of a subsequent burst is intercepted at a point of interception, and for generating a control window extending from the point of interception of a rising edge to a peak value of each subsequent pulse, a second peak detector enabled by the control window of the first detector for following the portion of the rising edge of each burst from the point of interception to the peak value, and for holding the peak value reached by the first detector during the control window, a first holding circuit responsive to the second detector and having a first, rapid time constant for rapidly acquiring a peak value of at least one initial peak of the burst, and having a second, slower time constant for adjusting the initially acquired peak value in light of subsequent peak values of the burst, and a switching circuit for automatically switching the first holding circuit from the first time constant to the second time constant.

In one aspect of the invention, the switching circuit includes a timer for timing an interval including at least one pulse of the burst. In this aspect, the timer preferably comprises a self clocking timer responsive to occurrence of the pulses of the burst.

In another aspect of the present invention the peak detector is for sampling and holding amplitudes of pulses of a first burst and a second burst, the first holding circuit holds amplitudes related to the first burst, and further comprising a second holding circuit for holding amplitudes related to the second burst, the second holding circuit being responsive to the switching circuit and having a first, rapid time constant for rapidly acquiring a peak value of at least one initial peak of the second burst, and having a second, slower time constant for adjusting the initially acquired peak value in light of subsequent peak values of the second burst.

These and other objects, advantages, aspects and features of the present invention will be more fully understood and appreciated upon consideration of the following detailed description of a preferred embodiment, presented in conjunction with the accompanying drawings.

DETAILED DESCRIPTION OF A PREFERRED EMBODIMENT

Figure 1:
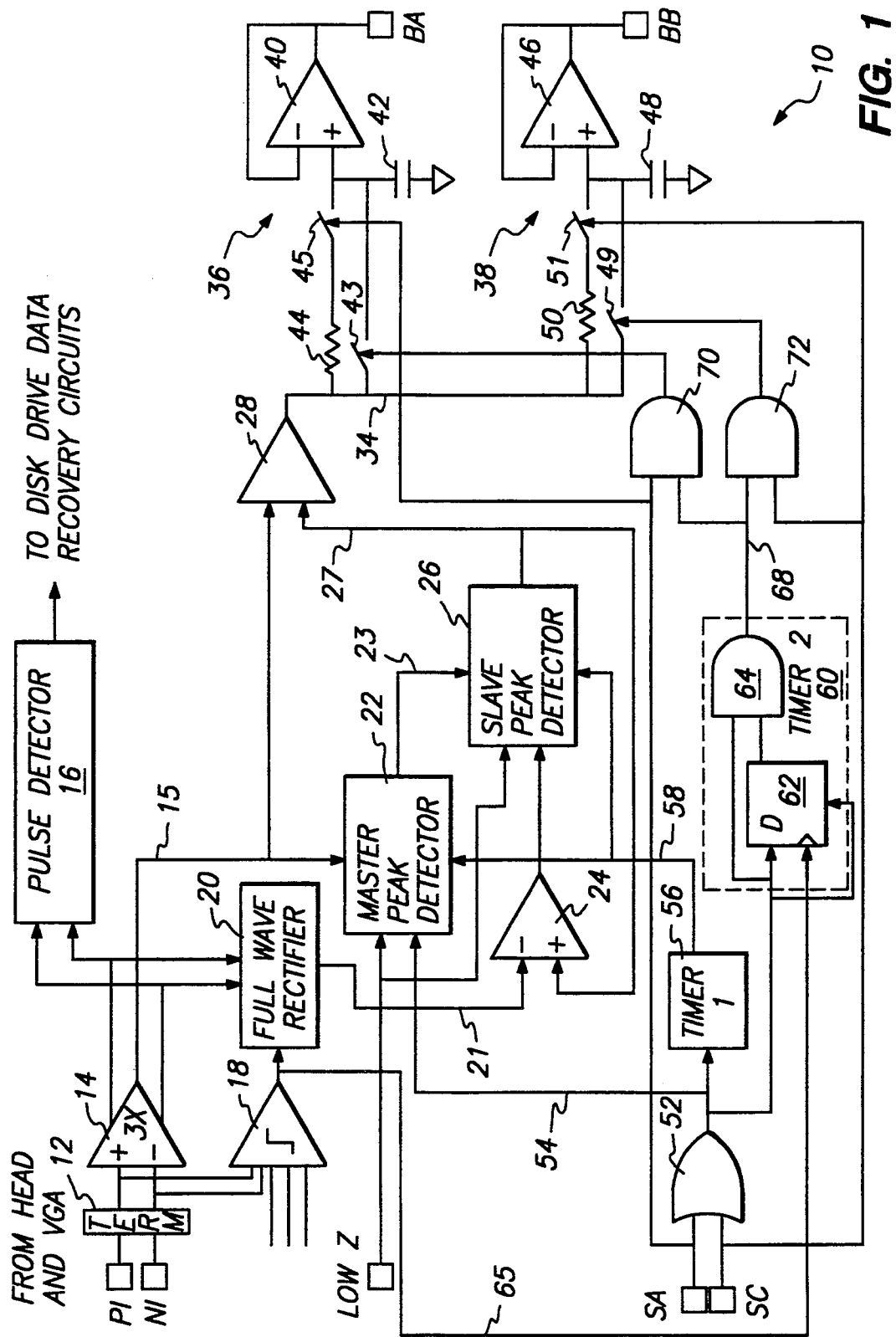
FIG. 1 is an electrical block diagram of a master-slave peak detector incorporating principles of the present invention.

With reference to FIG. 1 a servo pulse detector 10 in accordance with principles of the present invention includes a differential analog input PI and NI supplied from a preamplifier of a disk drive incorporating the circuit 10. The disk drive may be of a conventional design, preferably of the type employing embedded servo sectors. One example of a disk drive of this type is given in U.S. Pat. No. 4,669,004 referred to above. Another example is provided in copending U.S. patent application Ser. No. 07/710,171 filed on Jun. 4, 1991, now U.S. Pat. No. 5,255,136, the disclosure of which is incoporated herein by reference.

The differential input entering the circuit 10 passes through a suitable passive termination network for impedance matching, and then passes through a differential amplifier 14 which amplifies the incoming signal stream by a predetermined amplification factor, such as three times. The amplified differential signal is then passed to a pulse detector within a read channel of the disk drive. The amplified signal is also distributed to a full wave rectifier circuit 20, and a common mode signal extracted by the amplifier 14 is passed via a path 15 to a master peak detector 22 and also to a differential amplifier 28 within the peak detector circuit 10.

The servo pulse detector 10 and the data pulse detector 16 are most preferably portions of a large scale integrated circuit read/write channel which also may typically include data separation and data clock synchronization functions. Those functions, while essential to operation of a disk drive, are not pertinent to the present invention.

The differential amplifier 28 subtracts a value put out from a slave peak detector 26 from the common mode signal on the path 15, and amplifies the resultant difference signal by a predetermined amplification factor, such as 3.25 times, for example. An output from the amplifier 28 passes to two hold circuits 36 and 38. The hold circuit 36 holds a sampled amplitude from a first or "A" burst, while the hold circuit 38 holds a sampled amplitude from a second sampled burst or "C" burst. The presently preferred burst pattern is illustrated in FIG. 2 and discussed below.

The A burst hold circuit 36 includes an amplifier 40, a holding capacitor 42, a resistor 44 and two switches 43 and 45. Similarly, the C burst hold circuit 38 includes an amplifier 46, a holding capacitor 48, a resistor 50 and two switches 49 and 51. The holding circuits 36 and 38 are substantially as shown in FIG. 1. The switches 43, 45, 49 and 51 are preferably implemented as solid state switches within the integrated circuit including the servo peak detector 10.

Two digital control inputs are provided to the timing circuit. One input, sample "A" or SA, controls sampling of the A burst and actuates the switch 45. Another input, sample "C" or SC, controls sampling of the C burst and actuates the switch 51. When the switch 45 is closed (and the switch 43 is opened), the capacitor 42 is charged by a current flowing over the path 34 and through the resistor 44.

Figure 2:
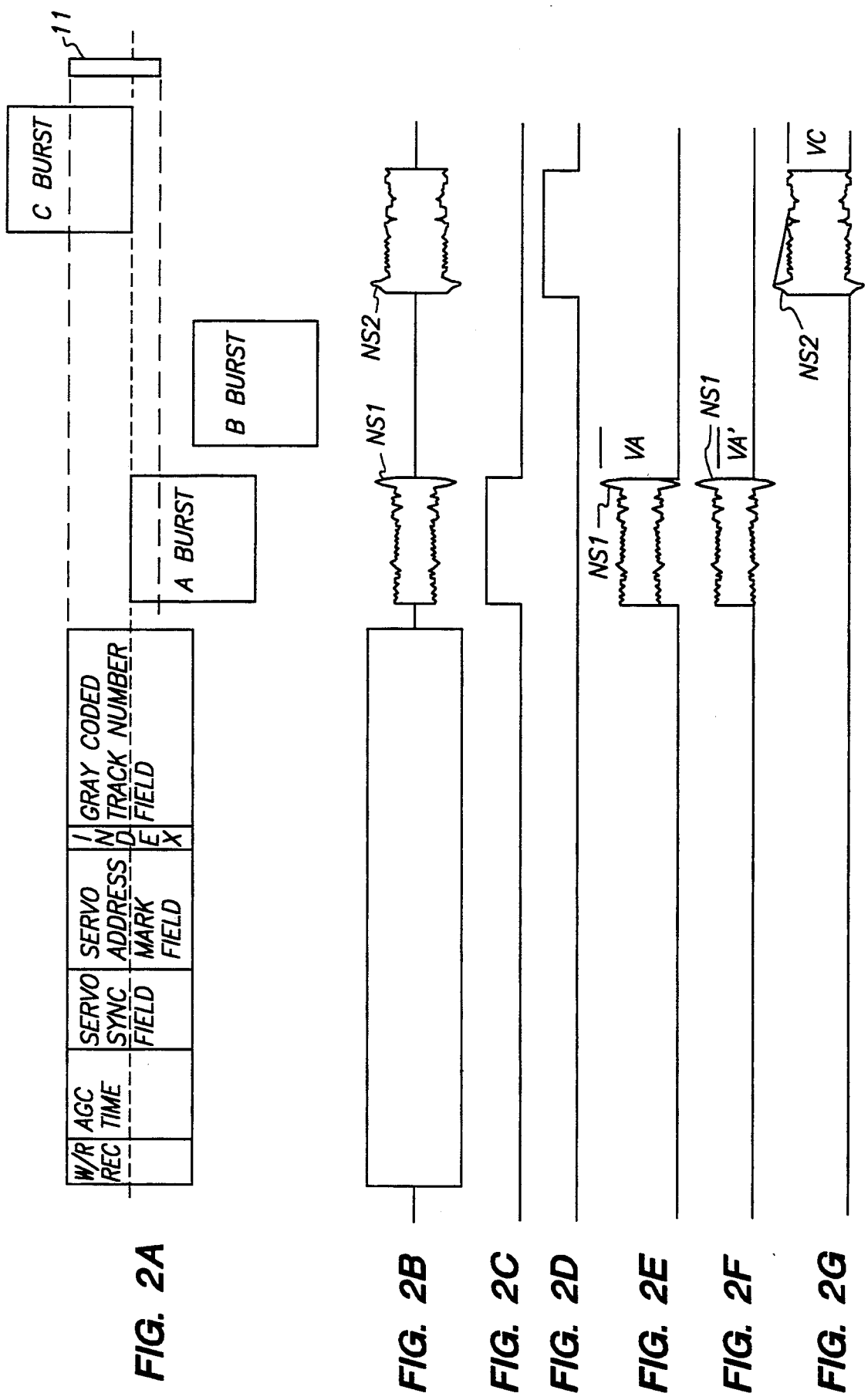
FIG. 2 comprises a series of graphs illustrative of a typical servo sector pattern and resultant burst amplitudes read by a data transducer head of a disk drive and illustrating the improvement achieved in peak detection with the FIG. 1 peak detector circuit.

The present invention will be more fully appreciated by reference to FIG. 2. Graph A of FIG. 2 illustrates a preferred information pattern for a servo sector. Many such sectors, such as 52 sectors or more, are embedded within circular data tracks of the hard disk drive including the circuit 10, for example. Each servo sector includes a number of fields. In the FIG. 2 example, a write to read recovery field is followed by an AGC adjustment field, so that read channel gain may be automatically adjusted to the frequency of the servo pattern. A servo sync field provides a clocking signal enabling clock synchronization and recovery of a servo address mark included in a servo address mark field. A short, one bit index field provides a once per revolution index marker pattern, marking a beginning of each circular track. A gray-coded track number field provides e.g. a 12 bit track number for providing absolute track number position information to the head positioner servo loop. Three burst fields, an A burst field, a B burst field, and a C burst field, are provided. During track seeking and settling, the A burst and B burst patterns are used, in accordance with the teachings of commonly assigned U.S. Pat. No. 5,170,299, entitled "Edge Servo for Disk Drive Head Positioner", the disclosure thereof being incorporated herein by reference.

Graph B of FIG. 2 illustrates an electrical signal developed by a data transducer head 11 of the associated disk drive from the servo pattern of Graph A. A signal envelope representing the information fields is followed first by an A burst envelope, and then by the C burst envelope, in accordance with the flight path or locus of the head 11 across the servo sector, as marked by the long dashed lines in Graph A.

One problem which is solved by the present invention is shown in the electrical signal resulting from burst A. In Graph B, a voltage or noise spike NS1 has occurred near the end of the A burst. Graph C represents the A burst sampling window SA, and Graph E represents a prior art peak detector which improperly sets itself to a level VA of the noise spike NS1, rather than to the average level of the A burst field.

On the other hand, Graph F of FIG. 2 illustrates operation of the FIG. 1 pulse detector. In Graph F, the voltage level VA' is essentially the average of the amplitudes of the pulses comprising the burst, and the noise spike at the end of Burst A has very little adverse impact on the level put out by the A burst holding circuit 36.

Graph G illustrates operation of the C burst holding circuit 38 in response to a noise spike NS2 occurring at the beginning of the burst. In this case, while the level of the noise spike NS2 is initially followed, due to the very quick action of the peak detector 10, over several noise free cycles, such as 5-10 cycles, the level is adjusted to a proper value VC. which is then available for quantization and use by the disk drive servo. One circuit arrangement facilitating proper sampling and holding of the relative burst amplitudes will now be described.

In accordance with an aspect of the present invention, very rapid charging of the capacitor 42 occurs when the switch 43 is closed, connecting the path 34 directly to the capacitor 42 and bypassing the resistor 44. The bypass arrangement occurs during the initial portion of the A burst, when it is desired rapidly to acquire the A burst amplitude. The timing circuitry for timing this initial acquisition will now be explained.

Figure 4:
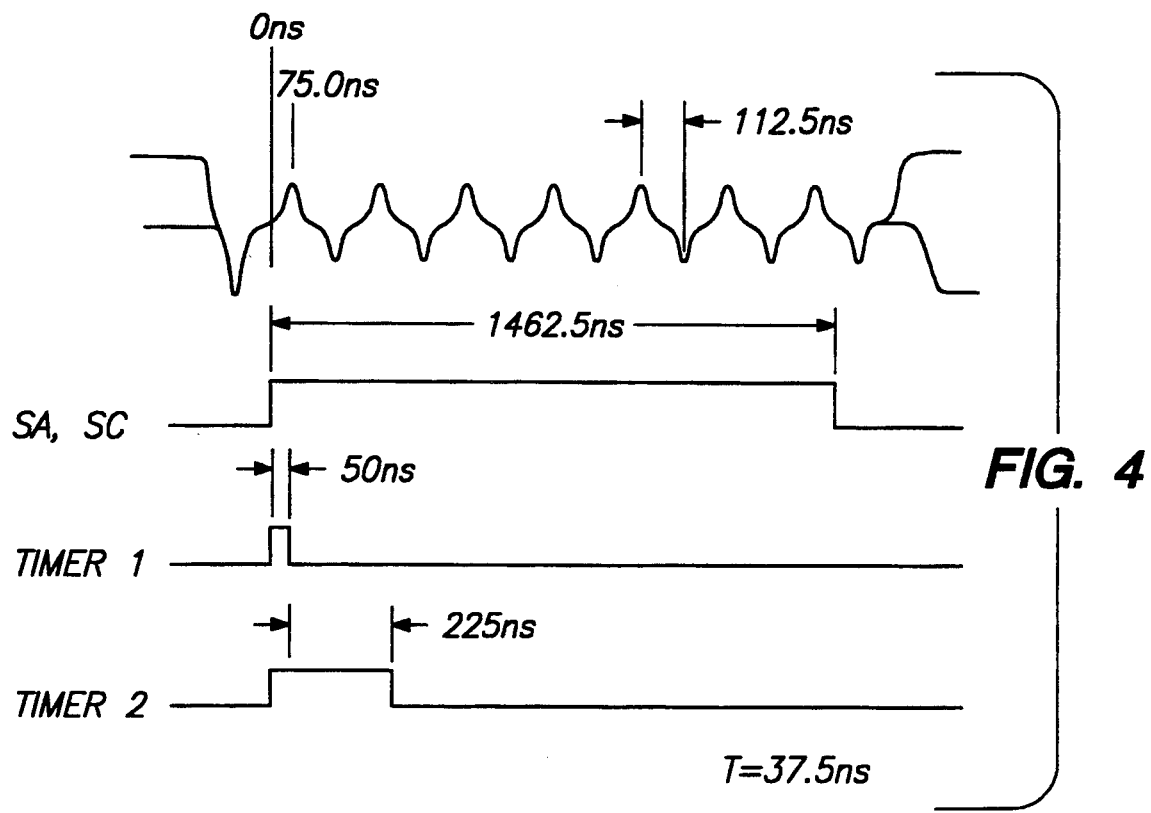
FIG. 4 is a series of timing diagrams illustrating timing signals for the FIG. 1 master-slave peak detector.

The sample A control SA and the sample C control SC pass through an OR gate 52 and provide a sample control window on a path 54, which is true throughout each servo burst, irrespective of the particular servo burst being sampled. The sample window on the path 54 extends to enable the master peak detector, and to clock a first timer 56 (called "Timer 1"), and to set a D-type flip-flop 62 of a second timer 60 (called "Timer 2"). As shown in FIG. 4, at the rising edge of the sample window, Timer 1 and Timer 2 are clocked. Timer 1 puts out a very short pulse, such as about 50 nanoseconds, and resets the master peak detector 22 as well as the slave peak detector 26. Timer 1 may be readily implemented as a one-shot. Timer 2 puts out a pulse which is considerably longer, e.g. 225 nanoseconds, which represents the period of one full cycle of the incoming 3T (100100100...) servo pattern. In order to be self clocking, Timer 2 is preferably implemented with a D flip-flop 62 and with an AND gate 64. The flip-flop 62 is set by the rising edge of the sample window signal on the path 54, and is clocked by the output from the comparator 18, so that precisely one full cycle of the incoming waveform represents the time period of Timer 2.

The comparator 18 is connected to receive and compare the incoming differential signal stream, so that during a 3T servo burst, its output represents a peak-to-peak square wave. The comparator 18 also has several control and threshold level inputs, so that it only operates above some minimum incoming level, and it controls operation of the full wave rectifier 20.

Figure 3:
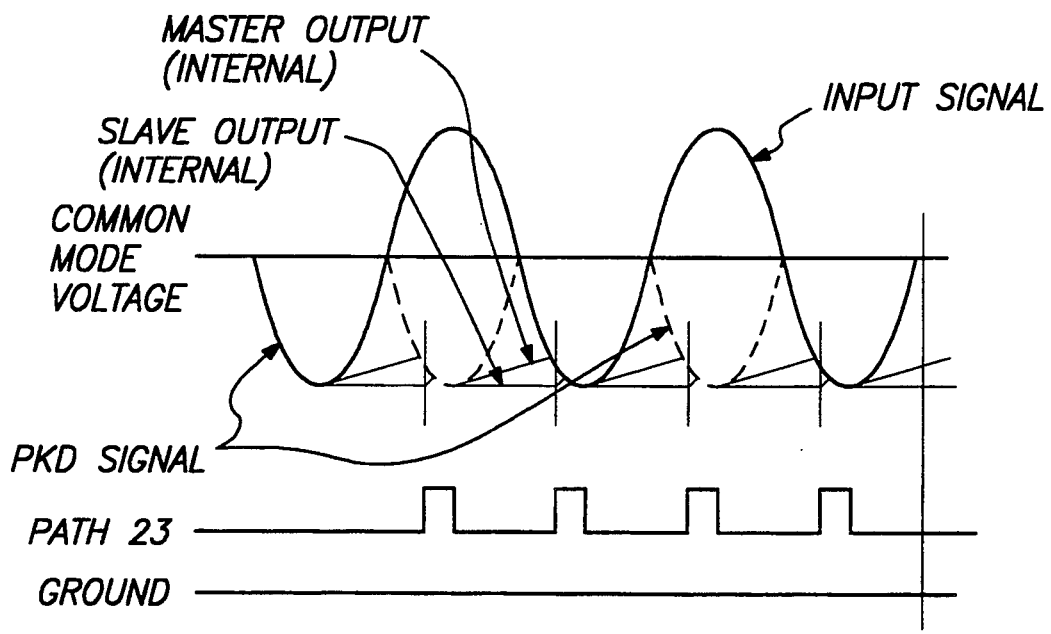
FIG. 3 is a graph of an incoming sinusoidal pulse stream upon which is superimposed full-wave rectification and outputs of the master pulse detector and slave pulse detector elements of the FIG. 1 embodiment.

The full wave rectifier 20 puts out a full wave rectification of the incoming signal stream. This rectification action is shown in FIG. 3 as a folding (dashed line) of the positive portion of the incoming sinusoidal signal about a common mode voltage reference. An output from the full wave rectifier 20 passes over a path 21 to a negative input of a differential amplifier 24. A positive input to the amplifier 24 is provided from the output of the slave peak detector 26.

The master peak detector 22, after being reset by assertion of the Timer 1 pulse on the path 58, and while the sampling window control signal on the path 54 is asserted, very quickly follows the incoming peak signal, as graphed in FIG. 3. After the peak is reached, the master peak detector internal output decays very rapidly, but not as rapidly as the incoming waveform, also as shown in FIG. 3. This rapidly decaying output is not put out from the master peak detector 22. Rather, it is used to develop a control signal, FIG. 3 which is output over the path 23 to control the slave peak detector 26. In other words, the slave peak detector 26 after being reset before each burst by assertion of the Timer 1 signal, and during its narrow sampling window established by the control on the path 23, follows the incoming waveform, from a location on its rising edge, to its maximum peak. Thereafter, the slave peak detector 26 is effectively disconnected, and holds the value reached at the peak of each rectified incoming pulse. This level is also shown in FIG. 3, and it is put out over a path 27 to the differential amplifier 28. During the time that the slave peak detector 26 is enabled, the difference between its held output and the signal provided by the full wave rectifier is followed. Since the slave peak detector 26 has a very slow decay characteristic, essentially, the peak value of each peak is held.

This peak value, differenced with the common mode signal at the amplifer 28, charges the capacitor 42 during A burst time, and charges the capacitor 48 during B burst time. Timer 2's output passes through either gate 70 for burst A and closes switch 43 for its duration, or gate 72 for burst B and closes switch 49 for its duration. The result is that the holding capacitors 42 and 49 immediately reach the sample level reached by the slave peak detector at the first full sampled peak. Thereafter, either switch 43 or 49 opens, and subsequent samples are scaled by resistors 44 or 50, as the case may be. The resistance imposed by the resistors 44 or 50 determines how much of each subsequent peak will be applied to adjust the value being held across the capacitor 42 or 48 in accordance with the RC time constant established by these respective components.

Having thus described an embodiment of the invention, it will now be appreciated that the objects of the invention have been fully achieved, and it will be understood by those skilled in the art that many changes in construction and widely differing embodiments and applications of the invention will suggest themselves without departing from the spirit and scope of the invention. The disclosure and the description herein are purely illustrative and are not intended to be in any sense limiting.

What is claimed is:

1. A peak detector for sampling and holding amplitudes of pulses of a signal burst comprising:

first detecting means for following a portion of a rising edge of each pulse until a peak amplitude is reached, and for decaying rapidly at a falling edge of each burst following the peak until a rising edge of a subsequent burst is intercepted at a point of interception, and for generating a control window extending from the point of interception of a rising edge to a peak value of each subsequent pulse, second detecting means enabled by the control window of the first detecting means for following the portion of the rising edge of each burst from the point of interception to the peak value, and for holding the peak value reached by the first detecting means during the control window, first holding means responsive to the second detecting means and having a first, rapid time constant for rapidly acquiring a peak value of at least one initial peak of the burst, and having a second, slower time constant for adjusting the initially acquired peak value in light of subsequent peak values of the burst, and switching means for automatically switching the first holding means from the first time constant to the second time constant.

2. The peak detector set forth in claim 1 wherein the switching means includes a timer for timing an interval including at least one pulse of the burst.

3. The peak detector set forth in claim 2 wherein the timer comprises a self clocking timer responsive to occurrence of said pulses of the burst.

4. The peak detector set forth in claim 1 wherein the peak detector is for sampling and holding amplitudes of pulses of a first burst and a second burst, wherein the first holding means holds amplitudes related to the first burst, and further comprising second holding means for holding amplitudes related to the second burst, the second holding means being responsive to the switching means and having a first, rapid time constant for rapidly acquiring a peak value of at least one intitial peak of the second burst, and having a second, slower time constant for adjusting the initially acquired peak value in light of subsequent peak values of the second burst.

5. A peak detector for sampling and holding amplitudes of pulses of a servo signal burst read by a read head from a servo pattern prerecorded upon a rotating data storage disk of a disk drive, comprising:

amplifier means for amplifying the servo signal burst read by the read head, a master detector responsive to the amplifier means for following a portion of a rising edge of each pulse until a peak amplitude is reached, and for decaying rapidly at a falling edge of each burst following the peak until a rising edge of a subsequent burst is intercepted at a point of interception, and for generating a control window extending from the point of interception of a rising edge to a peak value of each subsequent pulse, a slave detector enabled by the control window of the master detector for following the portion of the rising edge of each burst from the point of interception to the peak value, and for holding the peak value reached by the first detecting means during the control window, a first holding circuit responsive to the slave detector and including a first capacitor and having a first, rapid time constant-providing resistor enabling rapid acquisition across the capacitor of a peak value of at least one initial peak of the burst, and having a second, slower time constant-providing resistor for adjusting the initially acquired peak value across the first capacitor in light of subsequent peak values of the burst, and switching means for automatically switching the first holding circuit from including the first time constant-providing resistor to the second time constant-providing resistor, thereby providing a weighted average peak value across the first capacitor.

6. The peak detector set forth in claim 5 wherein the switching means includes a timer for timing an interval including at least one pulse of the burst.

7. The peak detector set forth in claim 6 wherein the timer comprises a self clocking timer responsive to occurrence of said pulses of the burst.

8. The peak detector set forth in claim 5 wherein the peak detector is for sampling and holding amplitudes of pulses of a first burst and a second burst, wherein the first holding circuit holds amplitudes related to the first burst, and further comprising a second holding circuit for holding amplitudes related to the second burst, the second holding circuit being responsive to the slave detector and including a second capacitor and having a third, rapid time constant-providing resistor for enabling rapid acquisition of a peak value of at least one initial peak of the second burst, and having a fourth, slower time constant-providing resistor for adjusting the initially acquired peak value across the second capacitor in light of subsequent peak values of the second burst, the switching means for automatically switching the second holding circuit from the third time constant-providing resistor to the fourth time constant-providing resistor, thereby providing a weighted average peak value across the second capacitor.

9. The peak detector set forth in claim 5 further comprising full wave rectifier means for full wave rectifying the amplified servo signal burst.

10. The peak detector set forth in claim 7 further comprising threshold comparator means for comparing the amplified servo burst signal and for providing a control output for controlling the master detector, and wherein the self-clocking timer comprises a D flip-flop clocked by the control output and having an input and a non-inverting output, and an AND gate having one input connected to the input of the D flip-flop and having another input connected to the non-inverting output thereof, the AND gate providing an output for the self-clocking timer.

* * * * *